United States Patent [19]

Hurtig, III

[11] 3,760,289

[45] Sept. 18, 1973

[54] ACTIVE FILTER NETWORK HAVING A VARIABLE CENTER FREQUENCY

[75] Inventor: Gunnar Hurtig, III, Santa Clara, Calif.

[73] Assignee: Kinetic Technology, Inc., Santa Clara, Calif.

[22] Filed: June 21, 1972

[21] Appl. No.: 265,095

[52] U.S. Cl. .................... 330/51, 328/167, 330/100

[51] Int. Cl. .................... H03f 1/14

[58] Field of Search .................... 330/51, 100; 328/167

*Primary Examiner*—Nathan Kaufman

*Attorney*—Roger S. Borovoy

[57] ABSTRACT

An active filter network having a variable center frequency including a first amplifier having first and second input terminals and an output terminal, the first input terminal being resistively coupled to the output terminal; an input terminal to the network resistively coupled to the second input terminal of the first amplifier; a second amplifier having first and second input terminals and an output terminal, the first input terminal being coupled to a point of fixed reference potential, the second input terminal being capacitively coupled to the output terminal of the first amplifier, and the output terminal of the second amplifier being resistively coupled to the input terminal of the first amplifier; a first pair of switching terminals adapted to have one of a first plurality of resistors each having different predetermined resistive values coupled therebetween; a means coupling a first terminal of the first pair of switching terminals to the output terminal of the second amplifier; a third amplifier having first and second input terminals and an output terminal, the first input terminal being coupled to a point of fixed reference potential, and the second input terminal being capacitively coupled to the output terminal; means coupling the second terminal of the first pair of switching terminals to the second input terminal of the third amplifier; a second pair of switching terminals adapted to have one a second plurality of resistors each having different predetermined resistive values coupled therebetween; a means coupling the first terminal of the second pair of switching terminals to the second input terminal of the second amplifier; a means coupling the second terminal of the second pair of switching terminals to the output terminal of the third amplifier; a pair of series-connected resistors having a connecting terminal therebetween and two other terminals; a means resistively coupling the output terminal of the third amplifier means to the connecting terminal of the pair of series-connected resistors; a means coupling the first of the other two terminals of the series-connected resistors to a point of fixed reference potential; a means coupling the second of the other two terminals of the series-connected resistors to the second terminal of the first amplifier; and an output terminal of the network coupled to the output terminal of the third amplifier, whereby the selection of one of the first plurality and one of the second plurality of resistors for connection into the first and second pairs of switching terminals respectively, together determine the center frequency of the network.

4 Claims, 3 Drawing Figures

Patented Sept. 18, 1973 3,760,289

2 Sheets-Sheet 1

ACTIVE FILTER NETWORK HAVING A VARIABLE CENTER FREQUENCY

BACKGROUND OF THE INVENTION

1. Field of the Invention

This invention is in the field of active filter networks, particularly networks which can be switched from one predetermined center frequency to another, selected from a plurality of available possible center frequencies. Such networks are useful, for example, in paging systems.

2. Prior Art

Circuits using operational amplifiers to synthesize an active filter network having a variable center frequency have been known for some time. A typical example of such circuitry has been described by Kerwin, Huelsman, and Newcomb in the IEEE Journal of Solid-State Circuits, Vol. SC2, pp. 87–92, September, 1967. Such a circuit is shown in FIG. 1, labeled PRIOR ART. The circuit serves the function of passing a signal having a predetermined center frequency from its input terminal to its output terminal, while rejecting all other signals. The primary disadvantage of the circuit of the prior art shown in FIG. 1 is that operational amplifiers $K_1$, $K_2$, and $K_0$ each has its own individual gain-bandwidth product. These gain-bandwidth products introduce error into the system, resulting in errors in the desired center frequency $\omega_0$ and quality factor Q of the circuit. The smaller the gain-bandwidth product, the more the error. In the circuit of the prior art, these gain-bandwidth products of each of the four amplifiers are cumulative, so that their overall effect is determined by adding the gain-bandwidth products of each of the four amplifiers. As a result, it has not been possible to obtain the degree of error-free operation of the circuit of the prior art which is desirable.

SUMMARY OF THE INVENTION

This invention overcomes the disadvantages of the prior art active filter networks. In the circuit of the invention, contrary to the prior art, the gain-bandwidth products of each of the three amplifiers cancel each other so that their contribution to the error in the center frequency and quality factor of the circuit is considerably less than that of the prior art. The circuit of the invention thus allows operation over a greater range of frequencies and temperatures than permitted by the circuits of the prior art, and yet provides the same stability over the greater ranges. Both the center frequency and the quality factor are more accurate and less sensitive to variations in the individual amplifier characteristics.

A preferred embodiment of the active filter network of the invention having a discretely variable center frequency requires three amplifiers. The first amplifier has two input terminals and an output terminal, the first input terminal being resistively coupled to the output terminal. The input terminal to the filter network of the invention is resistively coupled to the second input terminal of this first amplifier. The second amplifier also has first and second input terminals and an output terminal. The first input terminal is coupled to a point of fixed reference potential, for example ground. The second input terminal is capacitively coupled to the output terminal of the first amplifier, and the output terminal of the second amplifier is resistively coupled to the first input terminal of the first amplifier. The circuit includes two pairs of switching terminals for switching a selected one of two different groups of resistors into the circuit, each of the resistors having different predetermined resistive values. The first terminal of one pair of switching terminals is coupled to the output terminal of the second amplifier. The second terminal is coupled to the second input terminal at the third amplifier. The first input terminal of the third amplifier is coupled to a point of fixed reference potential, and the second input terminal is capacitively coupled to the output terminal. The second terminal of the first pair of switching terminals is coupled to the second input terminal of the third amplifier. The first terminal of the second pair of switching terminals coupled to the second input terminal of the second amplifier. The second terminal of the second pair of switching terminals is coupled to the output terminal of the third amplifier. Also included are a pair of series-connected resistors. The output terminal of the third amplifier is connected to the point where the series-connected resistors are connected. The first of the unconnected terminals of the series-connected resistors is coupled to a point of fixed reference potential. The other unconnected terminal is coupled to the second input terminal of the first amplifier. The output terminal of the entire network is coupled to the output terminal of the third amplifier, whereby the selection of one of the first plurality and one of the second plurality of resistors for connection into the two pairs of switching terminals together determine the center frequency of the network.

DETAILED DESCRIPTION OF THE INVENTION

Figure 2:
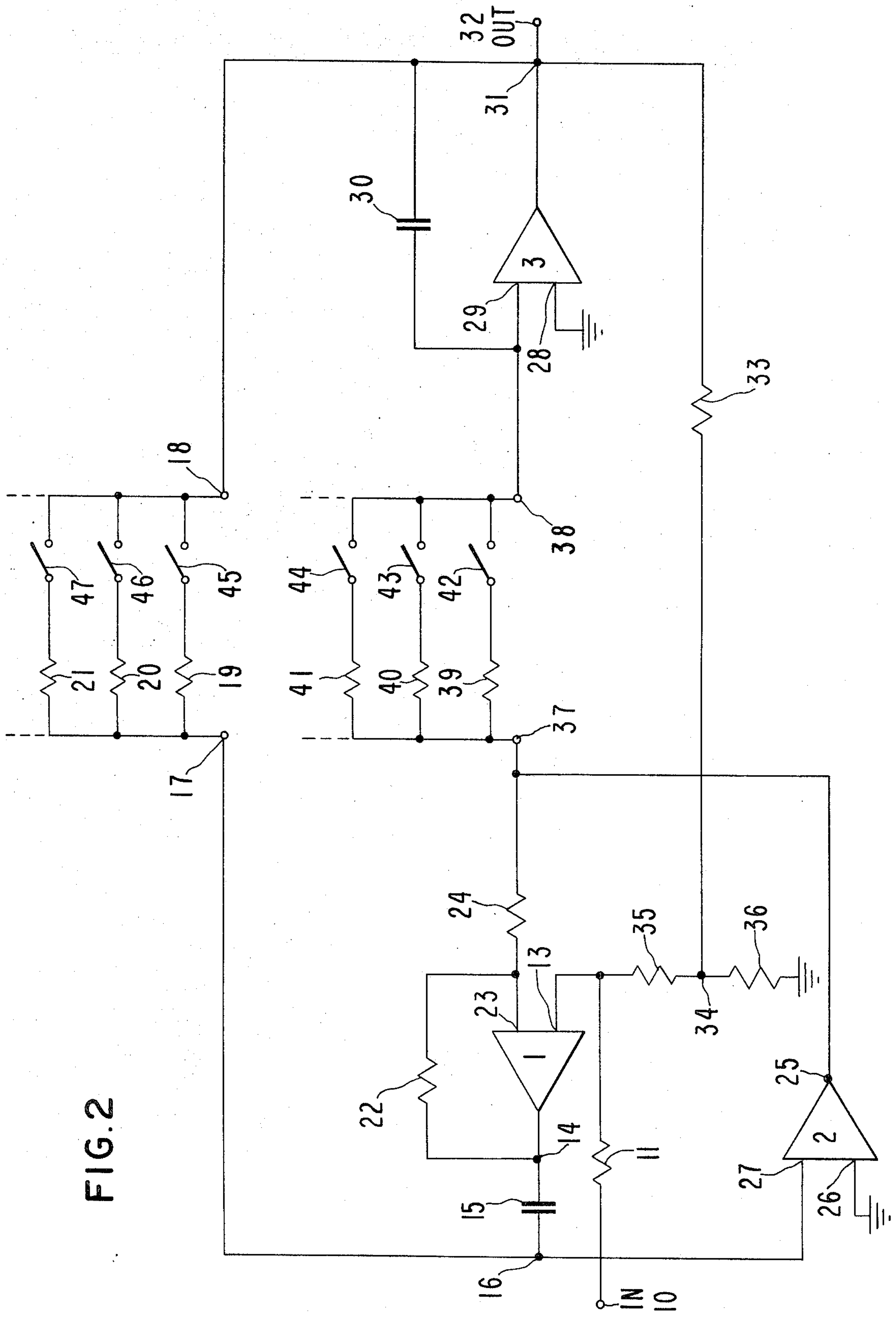
FIG. 2 is a block and schematic diagram of a circuit of a preferred embodiment of the network of the invention.

Referring to FIG. 2, the circuit of a preferred embodiment of the invention employs three operational amplifiers, amplifier 1, amplifier 2, and amplifier 3. These are integrated circuits readily obtainable commercially, for example the well-known "709" type operational amplifier. For the most error-free operation, the gain-bandwidth product of all three of these amplifiers should change in substantially the same manner over the range of normal operating temperatures. The easiest way to achieve this result is to locate all three amplifiers on the same monolithic chip of silicon semiconductor material. Such triple amplifier integrated circuits, formed on the single chip of silicon, are now commercially available. It is preferred that the gain-bandwidth products of each of the three amplifiers come within 10 percent of one another for best operating results.

In operation of the circuit of the invention, the input signal appears at terminal 10 shown in FIG. 2. The signal is passed through resistor 11 into terminal 12 which is connected to one input terminal 13 of amplifier 1. The output terminal 14 of amplifier 1 is coupled through capacitor 15 to terminal 16. Terminal 16 in turn is connected to terminal 17 which, along with terminal 18 make up a pair of switching terminals adapted to have one of a plurality of resistors 19, 20, or 21, each having different predetermined resistive values, coupled therebetween.

Resistor 22 is a feedback resistor coupling output terminal 14 of amplifier 1 to input terminal 23. Input terminal 23 is also connected to resistor 24 which in turn is connected to output terminal 25 of amplifier 2. Input terminal 26 of amplifier 2 is grounded and input terminal 27 of amplifier 2 is connected to terminal 16 which in turn is connected through capacitor 15 to the output terminal 14 of amplifier 1.

Input terminal 28 of amplifier 3 is grounded, as shown. Input terminal 29 is capacitively coupled through capacitor 30 to output terminal 31 of amplifer 3. In addition, output terminal 31 of amplifier 3 is coupled to the output terminal 32 of the entire filter network of the invention. Terminal 31 is also coupled through resistor 33 to the connecting terminal 34 of a pair of series-connected resistor 35 and 36, as shown. The terminal of resistor 36 not connected to resistor 35 is grounded, and the terminal of resistor 35 not connected to resistor 36 is coupled to terminal 12, which in turn is coupled to input terminal 13 of amplifier 1.

The circuit also employs a second pair of switching terminals 37 and 38. These terminals are also adapted to have one of a second plurality of resistors 39, 40, or 41 connected between them. Switching terminal 37 is connected to resistor 24 and to the output terminal 25 of amplifier 2. Switching terminal 38 is connected to input terminal 29 of amplifier 3.

Switches 42, 43, and 44 are shown by way of illustration in series with resistors 39, 40, and 41, respectively. Normally one of the three switches 42, 43, and 44 will be closed at any point in time. The selection of the proper one of these three switches to be closed determines which of the three resistors 39, 40, and 41 will be connected between switching terminals 37 and 38 at any particular point in time. Switches 45, 46, and 47 serve the very same function with respect to resistors 19, 20, and 21 to be connected between switching terminals 17 and 18. The invention is by no means limited to the use of exactly three different resistors in each of the pairs of switching terminals. In practice, many different values of resistance can be employed, using single resistors or combinations of resistors, three having been selected merely for illustration.

In practice, switches 42–47 are not mechanical switches, but are electronic switches. Electronic switches normally employ transistors or field effect devices. A typical electronic switch useful in this invention is shown in FIG. 3.

Figure 1:
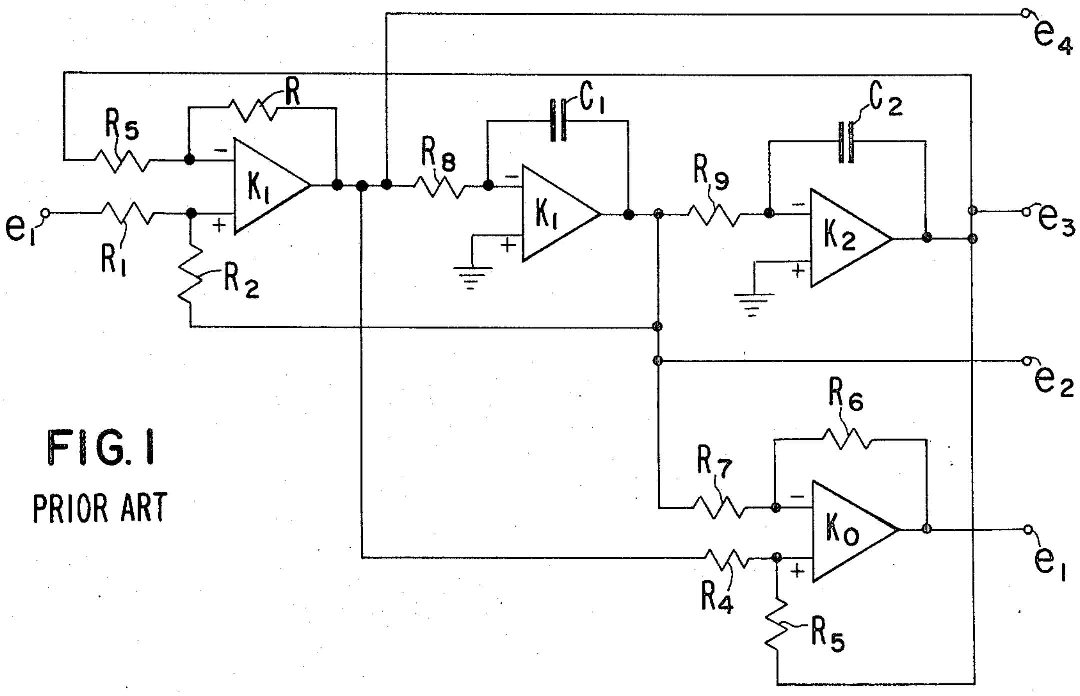
FIG. 1 PRIOR ART
FIG. 1 is a block and schematic diagram of a circuit of the prior art.
Figure 3:
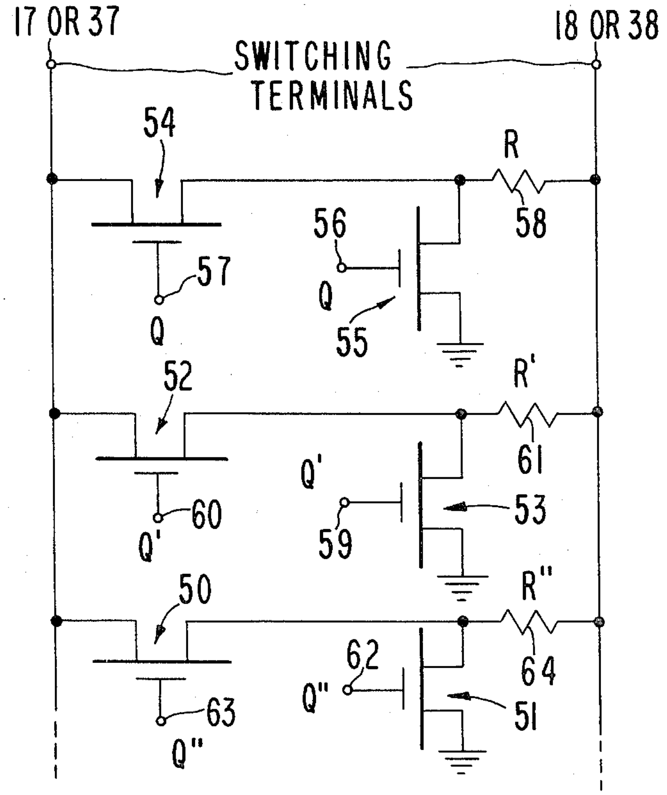
FIG. 3 is a block and schematic diagram of a typical switching system for switching resistors into and out of the circuit of FIG. 2.

Referring to FIG. 3, three switches are shown, each employing two field effect transistors. These field effect transistors can either be MOSFET's or PN junction FET's. The first switch employs FET 50 and FET 51; the second switch employs FET 52 and FET 53; and the third switch employs FET 54 and FET 55. The two terminals shown can be terminals 17 or 37, or terminals 18 or 38, respectively, of the circuit of FIG. 2. The logic signals employed to turn the switches on are complementary signals. If a signal Q is received at terminal 56 of transistor 55, the binary opposite or complement, and signal $\bar{Q}$ is received at terminal 57 of transistor 54, transistor 54 will be conducting and resistor 58, having a value R, will be connected between the switching terminals. Similarly, if the signal Q' is received at terminal 59 and signal $\bar{Q}'$ at terminal 60, transistor 52 will be conducting and resistor 61, having a resistive value R', will be connected between the switching terminals. Finally, if a signal Q'' is received at terminal 62 and a signal $\bar{Q}''$ is received at terminal 63, transistor 50 will be conducting and resistor 64, having a value R'' will be connected between the switching terminals.

The same circuit shown in FIG. 3 is useful for the connection to switching terminals 17 and 18 shown in FIG. 2, and also for the connection to switching terminals 37 and 38 shown in FIG. 2.

In practice, the circuit of the invention is useful, by way of example, in a "pocket paging" system. The circuit is located in each receiver unit, usually carried in one's pocket. Referring to FIG. 2, in normal operation of the circuit, there will always be a resistor connected between switching terminals 17 and 18, and between switching terminals 37 and 38. Let us assume, for example, that resistor 19 is connected between switching terminals 17 and 18 (switch 45 is closed) and resistor 39 is connected between switching terminals 37 and 38 (switch 42 is closed). Resistor 19 and 39 together define for the circuit of FIG. 2 the center frequency of a signal which, when it appears at input terminal 10, will cause an output signal at output terminal 32. Only an input signal having the center frequency determined by resistors 19 and 39 will generate an output signal at output terminal 32. Signals having all other center frequencies will not pass through the circuit of FIG. 2.

In the simplest case, the output terminal 32 could then be connected to a buzzer, a light, or other warning means to notify the holder of the paging unit that he is wanted. He then can call a telephone number, or whatever is desired in response to the page.

Normally, however, there are not enough discrete frequencies possible to have each receiver identified by a single center frequency. Therefore a code comprising a series of several different frequency tones are normally employed as a signal to identify the person holding the pager. In this event, the receipt of a first signal alone at output terminal 32, caused by the transmission of the proper signal to input terminal 10, is insufficient to generate a buzzing or light signal. The initial positive output signal at terminal 32, in pagers of this type, is then passed to a conventional logic network 70 shown in FIG. 2. For purposes of discussion, assume that the first signal received at output terminal 32 of FIG. 2 was the signal having a center frequency "Q". In order for this signal to have been passed through the circuit of FIG. 2, it was necessary that the proper resistors were connected between switching terminals 17 and 18, and switching terminals 37 and 38, respectively, to set the circuit of FIG. 2 to pass a signal having the center frequency "Q". Referring to FIG. 3, this means that transistor 55 had a "Q" logic value at terminal 56, and transistor 54 had a "$\bar{Q}$" logic value at terminal 57, and that resistor 58 was therefore connected between the proper switching terminals. Identical circuitry of the type shown in FIG. 3 may be used for switching terminals 17, 18, and for terminals 37, 38 (although the actual value of resistor 58 can and normally would be different in each of the two sets of switching terminals).

When the positive output signal resulting from the receipt of the input signal having a center frequency "Q" is received at output terminal 32, this signal passes into logic network 70. The logic network is normally a conventional sequential switching system, programmed to sequentially switch in a predetermined manner. By way of illustration, the first output signal Q, when passed into logic network 70 can serve to switch transistors 54 and 55, in FIG. 3, from their previous state to the opposite state. In that event, if another signal Q were to be received at the input of the network, transistor 54 in FIG. 3 will be an open circuit, and resistor 58 will no longer be in the circuit. Accordingly, this second "Q" input signal will not pass through the circuit as it did before. Instead of resistor 68, the logic network connects a different resistor into the circuit at the same time as it removed resistor 58 from the circuit. For example, the receipt of the first "Q" signal passing through to the logic network serves to switch logic network 70 to provide a "Q" and a "$\overline{Q}$' " into the transistors 55 and 54, respectively, in FIG. 3. At that time, transistor 52 will be conducting and resistor 61 will be connected in the circuit.

In that set of conditions, if the input signal at terminal 10 in FIG. 2 has a center frequency "Q' ", that signal will pass through the circuit since by definition, the signal of center frequency "Q' " requires resistor 61, shown in FIG. 3, connected between the appropriate switching terminals for transmission through the circuit. An output signal will then be received at output terminal 32 in FIG. 2, and is passed into logic network 70 for another sequential switching operation to set the network to pass a Q'' center frequency signal. If the next received tone corresponds to the newly set Q'' center frequency requiring resistor 64, for example, again an output signal will appear at output terminal 32. Assuming this third signal is the final required one, this final sequential switching of logic network 70 will then produce a tone or a light at the receiver unit in a conventional manner. The holder of the paging unit will then push a button to indicate acknowledgment of the tone or light, and this will cause the logic network to be reset so it will again be ready to receive the same proper sequence of signals. It will be programmed to be automatically reset upon the receipt of part of the sequence, but not the complete sequence.

The logic circuitry can be designed to require 3, 4, or many combinations of the same or different frequency signals, depending on the number of paging units in the entire system. Only when the proper combination of signals is received through the logic circuitry, denoting the particular individual being paged, will the buzzer or light unit in the pager be activated, telling the bearer that he is wanted.

Many more applications of the filter circuit of the invention will be apparent to those skilled in the art. Therefore the paging embodiment is provided merely by way of illustration.

What is claimed is:

1. An active filter network having a variable center frequency comprising:

a. a first amplifier means having first and second input terminals and an output terminal, said first input terminal being resistively coupled to said output terminal;
b. an input terminal to said network resistively coupled to said second input terminal of said first amplifier means;
c. a second amplifier means having first and second input terminals and an output terminal, said first input terminal being coupled to a point of fixed reference potential, said second input terminal being capacitively coupled to said output terminal of said first amplifier means, and said output terminal of said second amplifier means being resistively coupled to said first input terminal of said first amplifier means;
d. A first pair of switching terminals adapted to have one of a first plurality of resistors each having different predetermined resistive values coupled therebetween;
e. means coupling a first terminal of said first pair of switching terminals to said output terminal of said second amplifier means;
f. a third amplifier means having first and second input terminals and an output terminal, said first input terminal being coupled to a point of fixed reference potential, and said second input terminal being capacitively coupled to said output terminal;
g. means coupling the second terminal of said first pair of switching terminals to said second input terminal of said third amplifier means;
h. a second pair of switching terminals adapted to have one of a second plurality of resistors each having different predetermined resistive values coupled therebetween;
i. means coupling the first terminal of said second pair of switching terminals to said second input terminal of said second amplifier means;
j. means coupling the second terminal of said second pair of switching terminals to said output terminal of said third amplifier means;
k. a pair of series-connected resistors having a connecting terminal therebetween and two other terminals;
l. means resistively coupling said output terminal of said third amplifier means to said connecting terminal of said pair of series-connected resistors;
m. means coupling a first of said other two terminals of said series-connected resistors to a point of fixed reference potential;
n. means coupling the second of said other two terminals of said series-connected resistors to said second input terminal of said first amplifier means; and
o. an output terminal of said network coupled to said output terminal of said third amplifier means, whereby the selection of one of said first plurality and one of said second plurality of resistors for connection into said first and second pairs of switching terminals, respectively, together determine the center frequency of said network.

2. The active filter network of claim 1 further characterized by each of said amplifiers having a gain-bandwidth product which change over a range of normal operating temperatures in substantially the same manner.

3. The active filter network of claim 2 further characterized by each of said amplifiers being located in the same monolithic chip of silicon semiconductor material.

4. The active filter network of claim 1 further characterized by each of said amplifiers being an operational amplifier.

* * * * *